(12) United States Patent
Okuda et al.

(10) Patent No.: US 6,594,887 B1
(45) Date of Patent: Jul. 22, 2003

(54) PART MOUNTING APPARATUS AND PART SUPPLY APPARATUS

(75) Inventors: Osamu Okuda, Yamanashi (JP); Akira Kabeshita, Hirakata (JP); Naoyuki Kitamura, Yamanashi (JP); Yoshihiro Yoshida, Neyagawa (JP); Mamoru Inoue, Hirakata (JP); Kazuo Mori, Kofu (JP)

(73) Assignee: Matsushita Electric Industrial Co., Ltd., Osaka-fu (JP)

( * ) Notice: Subject to any disclaimer, the term of this patent is extended or adjusted under 35 U.S.C. 154(b) by 0 days.

(21) Appl. No.: 09/554,187
(22) PCT Filed: Nov. 9, 1998
(86) PCT No.: PCT/JP98/05049
§ 371 (c)(1),
(2), (4) Date: May 10, 2000
(87) PCT Pub. No.: WO99/25168
PCT Pub. Date: May 20, 1999

(30) Foreign Application Priority Data

Nov. 10, 1997 (JP) ............................................. 9-306678
Nov. 10, 1997 (JP) ............................................. 9-306680

(51) Int. Cl.[7] ............................. B23P 19/00; H05K 3/30
(52) U.S. Cl. ............................. 29/739; 29/759; 29/833; 29/836
(58) Field of Search .................... 29/832, 833, 834, 29/836, 729, 739, 741, 743, 744, 759, 760

(56) References Cited

U.S. PATENT DOCUMENTS 5,018,936 A * 5/1991 Izumi et al. .................. 29/740
5,740,604 A * 4/1998 Kitamura et al. ............. 29/740
6,006,425 A * 12/1999 Fukukura et al. ............. 29/832
6,161,214 A * 12/2000 Ishihara et al. ............... 29/832
6,189,207 B1 * 2/2001 Nagae .......................... 29/740
6,199,272 B1 * 3/2001 Seto et al. .................... 29/740
6,216,336 B1 * 4/2001 Mitsushima et al. .......... 29/721
6,257,391 B1 * 7/2001 Nishimori et al. ............ 29/832

FOREIGN PATENT DOCUMENTS

JP 997996 4/1997
JP 9186495 7/1997

* cited by examiner

Primary Examiner—Timothy V. Eley

(57) ABSTRACT

A component installing device comprises: a tray component supply section (8) having a plurality of conjointly provided tray component supply mechanisms (7) for moving selected trays (4) from a storage position (5) to a component supply position (6), according to need, thereby providing the components (2) accommodated therein for use; and a cassette component supply section (13) having a plurality of mutually aligned component supply cassettes (12) for carrying components in a tape cassette or a bulk cassette, and transporting said components to a component supply position (11), one at a time, thereby providing said components for use. Components (2) accommodated in the respective trays (4) located at the component supply positions (6) of the respective tray component supply mechanisms (7) in the tray component supply section (8), and components (2) transported to the component supply positions (11) of the respective component supply cassettes (12) in the cassette component supply section (13), are variously handled and installed at prescribed positions on a circuit board (1) by means of an installing head (21).

14 Claims, 6 Drawing Sheets

PART MOUNTING APPARATUS AND PART SUPPLY APPARATUS

TECHNICAL FIELD

The present invention relates to a component installing device, and more particularly, to a component installing device used in cases where electronic components of various types are installed directly on a circuit board, or cases where an electronic circuit board is manufactured by provisionally setting electronic components by means of cream solder, or the like, and then installing said components by means of reflow processing, or the like, and to a component supply device used to supply various components in a component installing device of this kind.

BACKGROUND ART

In order to install various electronic components of this type in a circuit board automatically (including provisional setting and actual installation), component supply mechanisms corresponding to the various types of components have been proposed and employed. For example, fine chip components are handled by means of component supply cassettes such as tape cassette or bulk cassette, in which components are supplied, one by one, to a prescribed position for use. Irregular components having a large or special shape, such as integrated circuits, connectors, or the like, are stored in an array in trays, several components of each different type being thus stored. When used, a prescribed tray of the various trays stored is selected and moved to a prescribed component supply position, where the components accommodated therein are supplied for use.

Conventionally, a variety of electronic components are supplied in a stable fashion by using component supply mechanisms of this kind in conjunction with a single component installing device, and even in the case of electronic circuit boards requiring a variety of electronic components, these components can be installed using a single component installing device or few component installing devices, thereby ensuring adaptability to increasing diversification in electronic components.

In recent years, there has been significant diversification and expansion of electronic components, with progress of integrated circuits, development in connectors, and the like. Therefore, it has become necessary to handle electronic components of many different types, forms, shapes, and sizes in components supply devices and component installing devices. Moreover, the number of electronic components required to manufacture a single electronic circuit board has also increased, due to increases in the size and functional range of electronic devices. In conjunction with this, there has also been demand for even higher speed operation in component supply, in order to achieve further improvements in productivity.

However, conventionally, in order to install the required types of components, a variety of component supply cassettes and a tray component supply mechanism have simply been used in conjunction with each other, but this has not enabled all of the various demands described above to be satisfied.

For example, depending on the electronic circuit board being fabricated, it may be necessary to install various types of large-scale electronic components, but if these components are mounted accordingly in a single tray component supply mechanism, there is a limit on the number of types of components that can be accommodated.

Moreover, although the tray component supply mechanism is suitable for supplying large-scale or specially shaped electronic components, it provides poor efficiency in supplying the plurality of trays accommodated therein, in a sequential fashion, according to the selection of component type. In other words, it moves a required tray of the trays accommodated in plural stages in a tray magazine to a position opposing a component supply position, whereupon the electronic component accommodated therein is supplied by drawing the tray out to the component supply position. Each time a different tray is selected, the tray at the component supply position is first accommodated in the tray magazine, whereupon a task for moving the subsequent tray to the component supply position is performed according to the same procedure, and hence a time lag arises when components of different types are supplied from the tray component supply mechanism in a sequential fashion, thereby causing productivity to decline. Moreover, since the component supply pattern is simple, it is difficult to achieve compatibility with various different component use patterns.

Furthermore, in the case of electronic components having a special shape, such as large-scale electronic components, connectors, or the like, which are not balanced with respect to their centre of gravity, the components are liable to fall off when handled by a component installing tool or component transfer head, and hence they cannot be handled at high speed. Therefore, if installing a variety of components by using various component supply cassettes and a tray component supply mechanism, which are provided conjointly, in a simple sequential fashion, it is necessary to delay the installation of other components whilst handling and installing components which have a slow handling speed, thereby impeding further speed increases in component installation.

It is an object of the present invention to provide a component installing device comprising a plurality of component supply cassettes and tray component supply mechanisms, whereby a plurality of different types of components can be handled by a single installing machine, and installation can be carried out at higher speed by devising component supply modes.

It is a further object of the present invention to provide a component supply device whereby the supply of components using trays can be performed with good efficiency, in accordance with the pattern of use of various components.

DISCLOSURE OF THE INVENTION

In order to achieve the aforementioned objects, the component installing device according to the present invention is characterized in that it comprises: a tray component supply section having a plurality of conjointly provided tray component supply mechanisms for selecting trays accommodating prescribed components, and moving the trays from a storage position to a component supply position, according to need, thereby providing the components accommodated therein for use; a cassette component supply section having a plurality of mutually aligned component supply cassettes for carrying components in a tape cassette or a bulk cassette, and transporting the components to a component supply position, one at a time, thereby providing the components for use; and an installing head for picking up components accommodated in the respective trays located at the component supply positions of the respective tray component supply mechanisms in the tray component supply section, and components transported to the component supply positions of the respective component supply cassettes in the cassette component supply section, according to need, and installing the components at prescribed positions on an installation object.

According to this construction, small components having a high frequency of use are handled by a cassette component supply section and components of various types are supplied successively from a plurality of component supply cassettes and are handled and installed at prescribed positions on an installation object by means of an installing head, in a continuous fashion corresponding to their frequency of use. In the meantime, special types of components are supplied in an alternating fashion by a plurality of adjacently provided tray component supply mechanisms in a tray component supply section, whereby even if the time for supplying and handling individual components is long, the time required to supply components of special types in a sequential fashion is reduced by a half and the supply rate of special components from trays is doubled, thus making it easier for the supply of special components from trays to be completed in time, whilst the installing head is handling and installing components supplied from the cassette component supply section in a continuous fashion. Therefore, in overall terms, it is possible to handle a larger number of different component types, the time lag involved in supplying components is reduced or eliminated, and hence high-speed operation of component installation can be achieved.

In addition to the foregoing, the component installing device according to the present invention is characterized in that it further comprises a plurality of component installing tools on said installing head for installing components aligned in a prescribed direction; a plurality of shuttles, which perform reciprocal movement in such a manner that they move a selected tray of one of the adjacently disposed tray component supply mechanisms from the storage position to the component supply position thereof and then return same to said storage position; component holding sections for holding components, provided on at least one of said shuttles and aligned in a direction and at a pitch corresponding to the alignment direction and alignment pitch of said component installing tools; and a component transfer head for picking up components accommodated in a tray that has been moved to a component supply position of a tray component supply mechanism and for loading these components onto said component holding sections; wherein said installing head is able to pick up the components held on said component holding sections and install same at prescribed positions of the installation object.

According to this construction, if there is a time surplus until the next tray component is used, when supplying special components by means of a plurality of adjacently provided tray component supply mechanisms, whilst the installing head is handling components supplied from the cassette component supply section in a continuous fashion according to the frequency of use thereof, then this time surplus is used to pick up components in a tray at a component supply position by means of the component transfer head and load a prescribed number of components onto the plurality of component holding sections provided on at least one of the shuttles which serve to extract and retract the trays in the tray component supply mechanisms, in such a manner that the prescribed number of components thus loaded are picked up together, as and when required, and handled and installed simultaneously, by means of the component installing tools on the installing head which coincide with the alignment direction and alignment pitch of the loaded components. Therefore, even in cases where a portion of the component installing tools pick up components directly from a tray located at a component supply position, the installation efficiency for components supplied by the tray component supply section can be increased by a factor equal to double the number of components that are picked up simultaneously, and hence significant increase in component installation speed can be achieved. In this case, desirably, the component holding sections are provided in equal number to the component installing tools on the installing head.

In addition to the respective characteristics described above, in the component installing device according to the present invention, if the component transfer head is devised in such a manner that components picked up from a tray are rotated preliminarily in a direction corresponding to their orientation for installation on the installation object by the installing head, before being held by the component holding sections, then components are rotated preliminarily without needing to provide a special time period in addition to the component supply operation from the tray component supply section performed whilst components supplied from the cassette component supply section are being installed by means of the aforementioned installing head. Thus the time period required conventionally for components to be subjected to image verification and rotated to a prescribed orientation, after they have been picked up by the installing head, is eliminated, thereby enabling components to be installed immediately after they have been picked up.

In addition to the respective characteristics described above, the component installing device according to the present invention is characterized in that, in cases where a component being handled is a problem component which causes an installation fault or other problem, the installing head discharges the component onto a problem component processing conveyor located at a prescribed position, the problem component processing conveyor being driven intermittently by a prescribed amount, each time it receives a discharged problem component, thereby conveying received problem components in a uniform direction at a uniform pitch, in such a manner that they can be supplied for processing, such as reinstallation, disposal, or the like. In this case, the present invention is also characterized in that, in cases where a problem component received from the installing head is larger than a reference component, the amount of conveyance is increases by an integral factor corresponding to the size ratio thereof.

According to the aforementioned construction, if there occurs a component causing an installation fault or other problems, when the installing head is successively picking up supplied electronic components of various types and installing same on an installation object, then this component is discharged onto a problem component processing conveyor located in a prescribed position, the problem components being conveyed at a uniform pitch by the problem component processing conveyor such that a space for receiving the next electronic component is provided, and the problem components on the problem component processing conveyor being processed manually for reuse, disposal, or the like, according to the respective components. In this case, even if the components handled by the installing head are of various different sizes, since the problem component processing conveyor is transported intermittently by an amount corresponding to the size of the component discharged on the problem component processing conveyor, it is possible to prevent situations where two discharged components overlap and interfere with each other, causing mutual damage or causing a component or components to slide off the conveyor. Furthermore, since the conveyance distance is reduced for small problem components, it is also possible to prevent situations where the whole problem component processing conveyor is transported further than necessary, the discharged electronic components are transported too rapidly, and hence the staff responsible do not have the opportunity to process these problem components correctly.

Moreover, in order to achieve the aforementioned objects, the component supply device according to the present invention is characterized in that it comprises: a plurality of adjacently provided tray component supply mechanisms for selecting trays accommodating prescribed components and moving said trays from a storage position to a component supply position, according to need, thereby providing the components accommodated therein for use; a plurality of shuttles, which perform reciprocal movement in such a manner that they move a selected tray of one of the respective tray component supply mechanisms from the storage position to the component supply position thereof and then return same to said storage position; component holding sections, provided on at least one of said shuttles, for holding components in a prescribed alignment direction and at a prescribed alignment pitch and for providing same for use; and a component transfer head for picking up components accommodated in a tray that has been moved to a component supply position of a tray component supply mechanism and for loading these components onto said component holding sections; wherein said tray component supply mechanisms have a first component supply mode, whereby respective selected trays are moved simultaneously to component supply positions, thereby providing the components accommodated in the respective trays for use, and a second component supply mode, whereby components accommodated in a tray located at a component supply position of a tray component supply mechanism are loaded onto the component holding sections of the same shuttle by means of the component transfer head, thereby providing said components for use.

According to the construction described above, in the aforementioned first component supply mode, wherein respectively selected trays are moved simultaneously to component supply positions, the plurality of adjacently provided tray component supply mechanisms are able to supply and provide for use, simultaneously or sequentially, a number of types of components corresponding to the number of adjacently provided tray component supply mechanisms, at the maximum, and therefore the efficiency of supplying electronic components of plural types is improved.

Moreover, in the second component supply mode, wherein components accommodated in a tray which has been moved to a component supply position of a tray component supply mechanism are loaded onto component holding sections of the same shuttle by means of a component transfer head, thereby providing the components for use, a plurality of components held in the respective holding sections of the shuttle can be picked up and provided for use simultaneously, and hence the number of operations and the amount of time involved in picking up components for use can be reduced. Moreover, by performing the loading of the aforementioned components in parallel with the operation of supplying components from further component supply sections, comprising a further tray component supply mechanism and other component supply mechanisms, it is possible to improve efficiency for tasks wherein a prescribed number of components are handled in a similar manner.

Moreover, the component supply device according to the present invention is characterized in that the component transfer head comprises a component transfer tool for picking up components accommodated in a tray located at a component supply position and loading same onto the component holding sections of a shuttle, by means of upward and downward motion, and an area sensor for detecting at which component supply position of the respective tray component supply mechanisms the component transfer head is located, movement of the tray being prohibited at the component supply position where the area sensor detects the component transfer head to be located.

According to the construction described above, tray movement is permitted at the component supply position where the component transfer head is not located and tray movement is prohibited at the component supply position where the component transfer head is not located. The component transfer tool provided on the component transfer head moves upwards and downwards in order to pick up and load components, but since the trays cannot move at the component supply position where the component transfer head is located, it is possible to perform the operations of picking up components accommodated in a tray and loading the picked up components onto the respective component holding sections of a shuttle, in a safe manner, without problems of interference caused by accidental movement of the trays, due to malfunction, or the like. On the other hand, tray movement is permitted at the component supply position where the component transfer head is not located, and therefore a tray accommodating prescribed components can be moved into position, or a positioned tray can be exchanged for another tray, whilst the component transfer head is picking up and loading components at the other component supply position, without fear of interfering with the component transfer head. Consequently, supply of components can be performed in a safe manner, including the operation of loading components accommodated in a tray onto component holding sections on a shuttle by means of a component transfer head.

The component supply device according to the present invention is also characterized in that the component transfer head is prohibited from moving to another component supply position, when the component transfer tool of the component transfer head is lowered at the component supply position where the area sensor detects the component transfer head to be located.

According to the construction described above, it is possible to prevent the component transfer tool of the component transfer head from interfering with other members by moving between component supply positions whilst it is in a lowered state, and therefore interference caused by accidental movement of the component transfer head due to malfunction, or the like, can be prevented.

Moreover, if the component supply device according to the present invention is constituted in such a manner that the area sensor is provided on a fixed section and detects a long member connected to the component transfer head and moving in conjunction with same, then the wiring required for detection is simplified and the location of the component transfer head can be detected between a plurality of component supply positions.

Furthermore, in order to achieve the aforementioned objects, the component installation method according to the present invention is characterized in that components transported from a tray component supply section comprising a plurality of adjacently provided tray component supply mechanisms for storing trays accommodating prescribed components in a plurality of levels and moving a selected tray from a storage position to a component supply position, according to need, thereby providing the components accommodated therein for use, and components transported from a cassette component supply section comprising a plurality of aligned component supply cassettes for holding components in a tape cassette or a bulk cassette and transporting these components to a component supply position, one at a time, thereby providing the components for use, are picked up and installed at prescribed positions on an installation object by means of an installing head, according to need.

Moreover, the component supply method according to the present invention is a component supply method for selecting a tray accommodating prescribed components in one of a plurality of adjacently provided tray component supply mechanisms, and moving the tray from the storage position thereof to a component supply position, thereby providing the components accommodated therein for use, characterized in that, in a first component supply mode, respective selected trays of the jointly provided tray component supply mechanisms are moved simultaneously to a component supply position, thereby providing the components accommodated in the respective trays for use, by means of shuttles which perform reciprocal movement in such a manner that they move selected trays from the storage position thereof to a component supply position and then return same to the storage position, and in a second component supply mode, components accommodated in a tray located at a component supply position of a tray component supply mechanism are loaded onto component holding sections provided on at least one of the shuttles for holding components in a prescribed alignment direction and at a prescribed alignment pitch, thereby supplying the components for use, by means of a component transfer head for picking up and loading components accommodated in a tray located at a component supply position of a tray component supply mechanism.

According to the component installation and supply methods described above, the supply rate of special types of components from trays can be doubled by supplying special components in an alternating fashion from a plurality of adjacently provided tray component supply mechanisms in a tray component supply section, whilst components having a high frequency of use are supplied and installed from a cassette component supply section. Therefore time lag in component supply can be eliminated and increased speed in component installation can be achieved. Furthermore, in the second component supply mode of the tray component supply mechanisms, since a plurality of components held on the component holding sections of a shuttle are picked up and provided for use simultaneously, it is possible to raise installation efficiency by reducing the number of tasks and the required time involved in handling components.

BEST MODE FOR CARRYING OUT THE INVENTION

Preferred embodiments of the present invention will be hereinafter described in detail with reference to the accompanying drawings.

Figure 1:
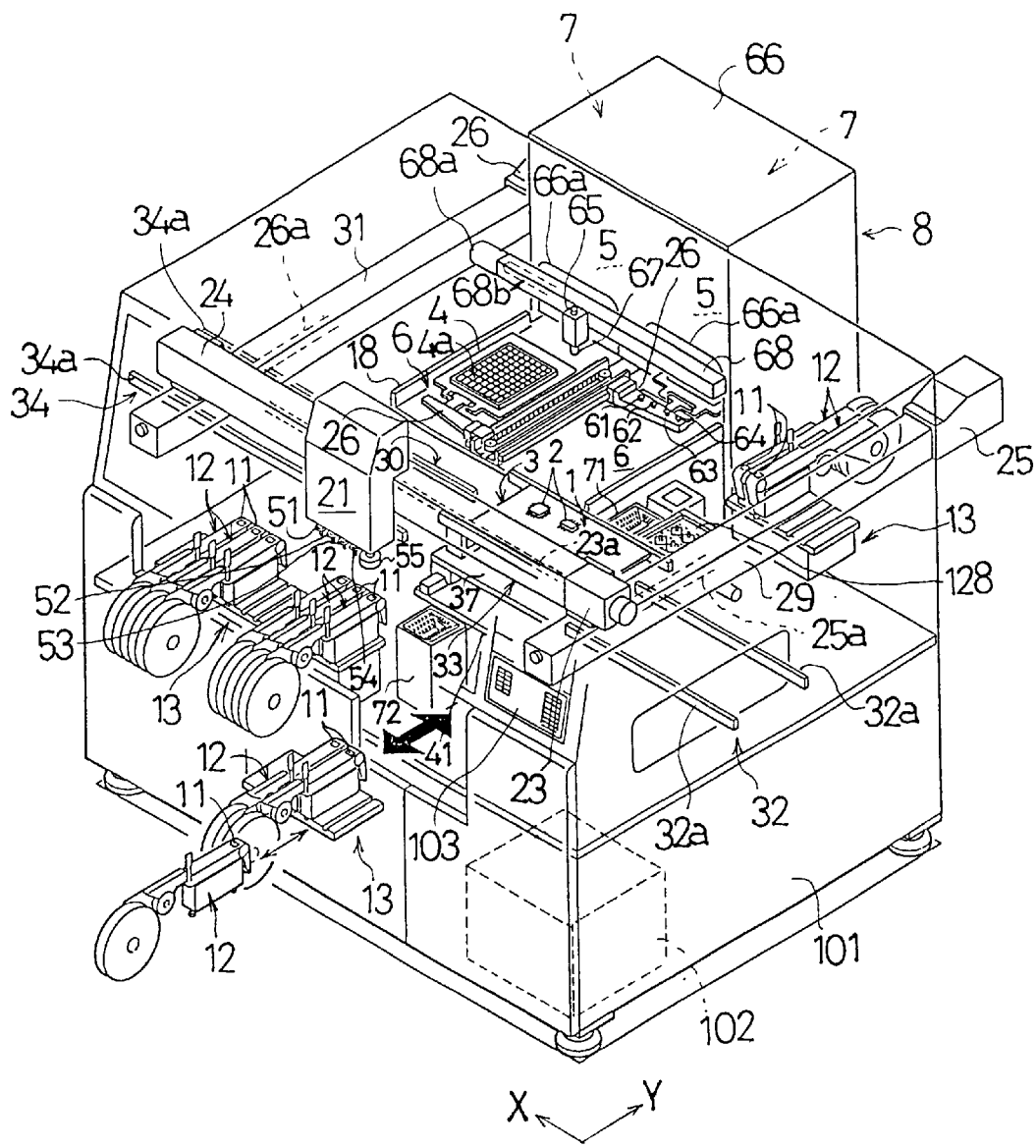
FIG. 1 is a perspective view showing the schematic construction of a component installing device according to a representative embodiment of the present invention.

As shown in FIG. 1, the present embodiment relates to a component installing device for manufacturing an electronic circuit board 3 by installing electronic components 2 of various types, such as a connector in this example, to circuit board, which is the installation object in this example. However, the present invention is not limited to this, and may also be applied to the assembly, manufacture or fabrication of various types of item, wherein various types of components are installed on various types of installation object.

Figure 2:
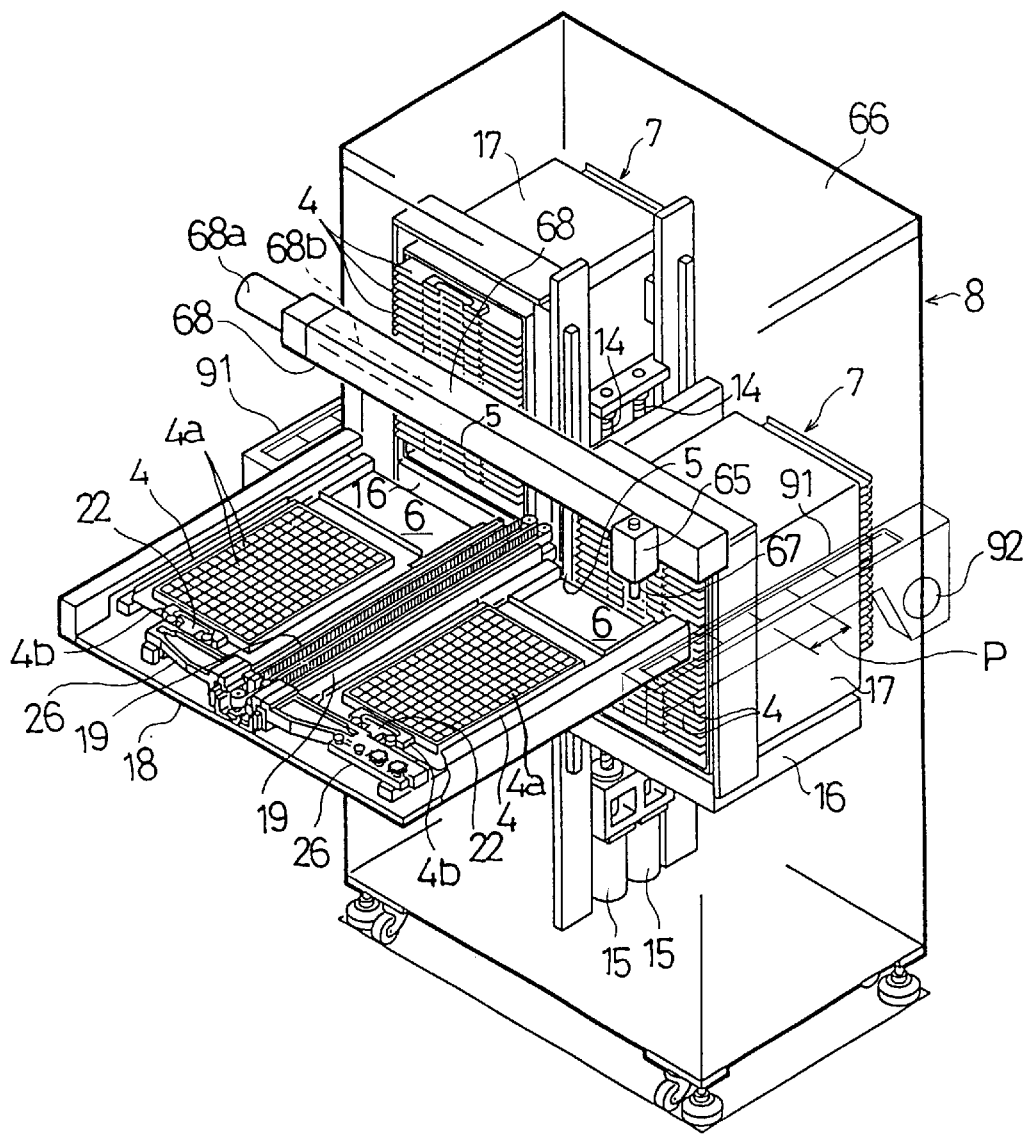
FIG. 2 is a perspective view showing the schematic construction of a tray component supply section of the component installing device in FIG. 1.

In FIG. 1, in order to handle electronic components 2 of various types, there are provided: a tray component supply section 8 comprising a plurality of adjacently provided tray component supply mechanisms 7 for selecting a tray 4 accommodating a prescribed component and moving same from its accommodation position 5 to a component supply position 6, as and when necessary, thereby supplying the electronic components 2 accommodated therein for use, as illustrated in FIG. 2; and a cassette component supply section 13 comprising a plurality of adjacently located component supply cassettes 12 for picking up components in a tape cassette or a bulk cassette, and conveying electronic components 2, one at a time, to a component supply position 11. An electronic circuit board 3 is manufactured by picking up electronic components 2 of various types supplied by the aforementioned tray component supply mechanisms 7 and cassette component supply section 13, as and when required, by an installing head 21, which is movable in mutually orthogonal X and Y directions, as observed in plan view, for example, and by installing them at prescribed positions on a circuit board 1.

As illustrated in FIG. 2, the tray component supply mechanisms 7 each comprise a raising and lowering platform 16 which is raised and lowered by means of a screw axle 14 being caused to rotate in forward and reverse directions by a motor 15. A tray magazine 17 accommodating a plurality of trays 4 is mounted and registered in a prescribed position on the top of each raising and lowering platform 16, in such a manner that it is prevented from falling off accidentally by means of a locking member (not illustrated), which locks it in place. Each tray magazine 17 accommodates a plurality of trays 4 accommodating electronic components 2 of various types in plural stages, in such a manner that they can be removed and inserted individually by separating them in a vertical direction by means of a lateral rail (not illustrated).

An extension table 18 on which the trays 4 are drawn out is provided at the component supply position 6 set to the front of the raising and lowering platform 16 of the tray magazine 17, commonly for each of the tray component supply mechanisms 7. A shuttle 26 is provided on top of the extension table 18 for drawing out and retracting a tray 4 located in an opposing position inside the tray magazine 17, by driving same reciprocally in the Y direction by means of a timing belt 19 provided in such a manner that it passes through the central portion of the extension table 18. The tray magazine 17 is controlled by the raising and lowering of the raising and lowering platform 16, in such a manner that a tray 4 accommodating electronic components 2 to be supplied is positioned at a height at which it can be removed onto the extension table 18, so that the tray 4 is pulled out by the shuttle 26 to the component supply position 6 on the extension table 18, whereby a prescribed electronic component 2 can be supplied. When an electronic component 2 accommodated on a separate tray 4 is to be supplied, the tray 4 pulled out to the component supply position 6 is pushed back to the original height position corresponding to the tray magazine 17, whereupon the height of the tray magazine 17 is controlled by the raising and lowering platform 16 in such a manner that a tray 4 accommodating an electronic component 2 to be supplied is subsequently positioned at the extracting and retracting height and is pulled out to the component supply position 6.

The shuttle 26 has a linking member 22 for drawing out and retracting said tray 4, and the linking member 22 is opened and closed by means of an actuator (not illustrated). By means of opening and closing, the linking member 22 can be coupled with a linking section 4b of the tray 4 in the direction in which the tray 4 is removed, for example, and can be disengaged therefrom. When the linked member 22 is in a linked state with the tray 4, the tray 4 can be extracted or retracted with respect to the tray magazine 17. On the other hand, in a state where the tray 4 and linking member 22 are not coupled, since the linking member 22 is separated from the tray, it does not impede the movement of the tray 4 associated with raising or lowering of the tray magazine 17 and it can also be withdrawn to a position wherein it does not cause an impediment of this kind.

Recesses 4a are formed separately in a matrix fashion on the tray 4, in accordance with the shape and size of the electronic components 2 accommodated therein, and the tray 4 accommodates and handles the electronic components 2 in these respective recesses 4a in the form of an array wherein the corresponding electronic components 2 are held in a prescribed orientation. The tray 4 is suitable for handling flat electronic components 2, and flat, large-sized and irregularly shaped electronic components 2 and can hold such electronic components 2 while positioning them in a prescribed direction by the recess 4a on the tray 4.

On the other hand, the component supply cassettes 12 are suitable for handling electronic components, such as very small chip components of many various types, and the like, which have a much higher frequency of use than the electronic components 2 handled by the trays 4. A plurality of these component supply cassettes 12 are provided in an array in the cassette component supply section 13, in such a manner that a large number of electronic components 2 can be supplied thereby.

Essentially, the tray component supply section 8 and cassette component supply section 13 can be arranged in any configuration which makes it possible for electronic components 2 supplied by relative movement thereof with respect to the installing head 21 to be picked up by the installing head 21, as and when necessary, and installed at prescribed positions on the circuit board 1, by relative movement of the electronic components 2 picked up by the installing head 21 with respect to the circuit board 1.

For example, high-speed component installation can be achieved by the following construction. The cassette component supply section 13 handles small electronic components 2 of many various types which have a high frequency of use, electronic components 2 of many types being supplied in a sequential fashion by a plurality of component supply cassettes 12 and these components being handled by the installing head 21 in a continuous fashion up to a number corresponding to their frequency of use and installed successively in prescribed positions on the circuit board 1. Meanwhile, the tray component supply section 8 supplies special types of electronic components 2 in alternating fashion, by means of a plurality of jointly provided tray component supply mechanisms 7. In this manner, even if the handling time for supplying individual electronic components 2 is long, it is possible to reduce by half the time required to supply special electronic components 2 in a sequential fashion, and hence the supply rate of electronic components 2 of different types from the trays 4 can be doubled, making it easier for the supply of electronic components 2 of different types from the trays 4 to be completed in time, whilst the installing head 21 is handling and installing electronic components 2 supplied from the cassette component supply section 13, in a continuous manner. The overall consequence of this is that it becomes possible to handle a larger number of different types of electronic components 2, and moreover, the time lag for supplying components can be reduced to a very short time or zero, thereby enabling high-speed component installation to be achieved.

The installing head 21 moves reciprocally in the X and Y directions, as illustrated in FIG. 1. In other words, it is supported on an X direction table 24 and is caused to move reciprocally in the X direction by forward and reverse rotation of a screw axle 23a driven by a motor 23. Furthermore, both end regions of the X direction table 24 are supported by Y direction tables 29, 31, and are caused to move reciprocally in the Y direction by forward and reverse rotation of screw axles 25a, 26a, provided respectively to the Y direction tables 29, 31 and operated by synchronously driven motors 25, 26. On the other hand, the circuit board 1 is conveyed in the X direction and supplied for component installation by the installing head 21. The circuit board 1 is supplied for component installation by being passed through a loading section 32 comprising a pair of conveyor rails 32a and transported to a component installation position 33, and after component installation at the component installation position 33, the electronic circuit board 3 is conveyed via an unloading section 34 comprising a pair of conveyor rails 34a. In combination, this loading section 32, component installation position 33, and unloading section 34 constitute a conveyance path 30 for the circuit board 1 and electronic circuit board 3.

Figure 3:
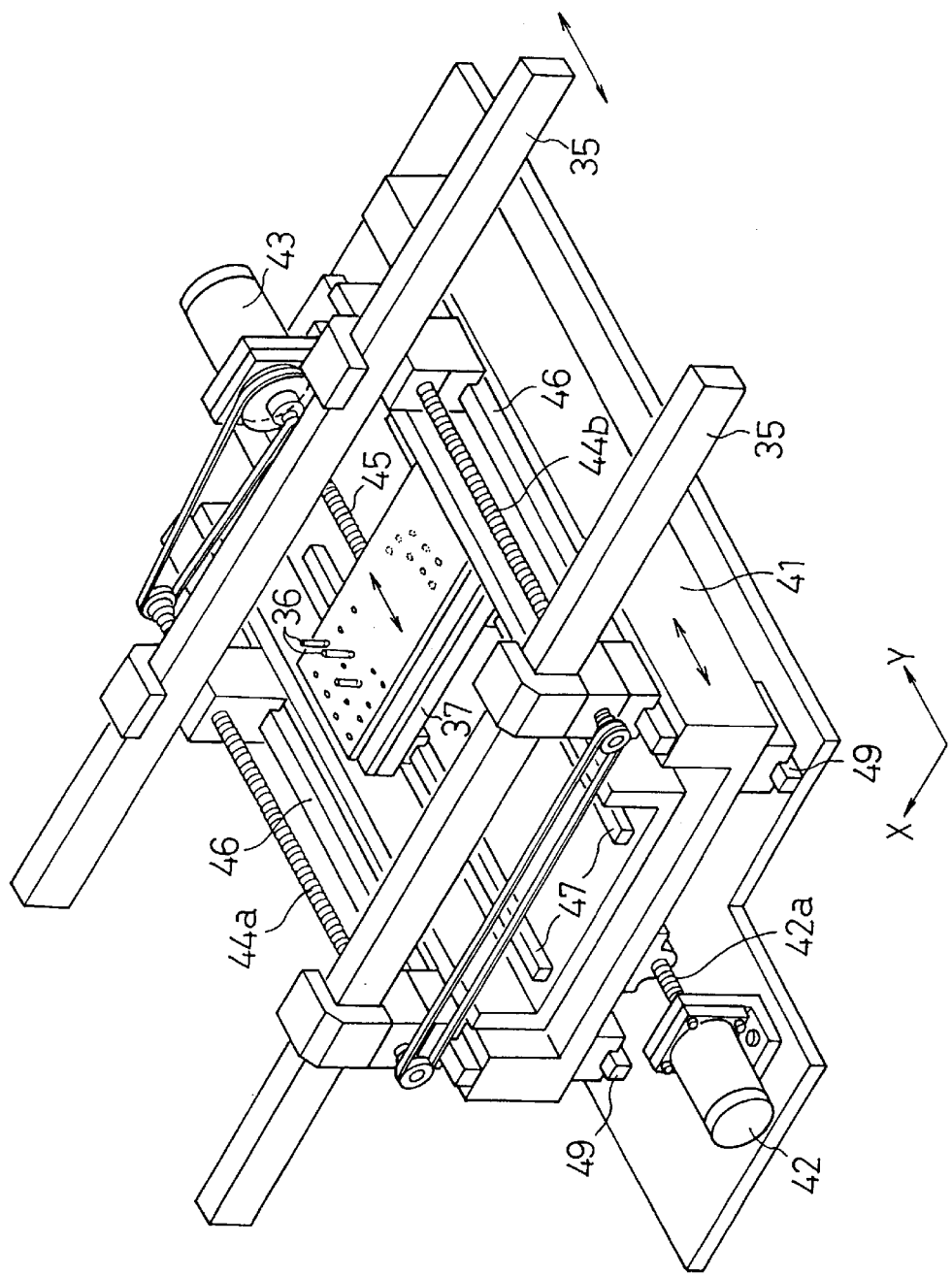
FIG. 3 is a perspective view showing an overall construction including a Y direction movement mechanism for a position registering support platform in the component installing device shown in FIG. 1.

As shown in FIG. 1 and FIG. 3, a pair of conveyor rails 35 for importing the circuit board 1 and exporting the electronic circuit board 3, and a position registering support platform 37 for supporting the imported circuit board 1 from below between the pair of conveyor rails 35 and registering the position thereof, are provided at the component installation position 33. Support pins 36, and the like, which support the circuit board 1 from below, without interfering with electronic components 2 installed on the downward-facing supported side of the circuit board 1, in the case of a double-sided circuit board 1, for example, are provided on the position registering support platform 37.

The tray component supply section 8 and the cassette component supply section 13 are disposed in such a manner that they lie on either side of the aforementioned conveyance path 30 for the circuit board 1 and electronic circuit board 3, as illustrated in FIG. 1. When disposed in this manner, the length in the X direction of the space required to position the respective tray component supply mechanisms 7 and component supply cassettes 12 adjacently in the X direction is halved. However, the positional configuration may be adapted freely, and in the present embodiment, a cassette component supply section 13, wherein a small number of component supply cassettes 12 are arranged in the X direction, is also provided to the side of the tray component supply section 8. In other words, by increasing the number of aligned component supply cassettes 12, the overall length in the X direction of the space occupied by the component supply sections becomes approximately equal on both sides of the conveyance path 30, and hence the whole conveyance path 30 through the whole device forms an effective space for performing component supply.

It should be noted that the number of adjacently positioned tray component supply mechanisms 7 in each tray component supply section 8 and the number of tray component supply sections 8 provided, and moreover, the number of adjacently positioned component supply cassettes 12 in each cassette component supply section 13 and the number of cassette component supply sections 13 provided, as well as the positional configuration of same, can be designed freely in various different ways.

In the present embodiment, since the component supply sections 8, 13 are disposed separately on either side of the conveyance path 30, in order for the installing head 21 to pick up electronic components 2 supplied respectively by the tray component supply section 8 and the cassette component supply section 13, the installing head 21 traverses the aforementioned conveyance path 30 in the Y direction, depending on the pick-up sequence for the electronic components 2. The amount of movement of the installing head 21 in this case is large compared to cases where it does not traverse the conveyance path 30, thereby causing the amount of time required to pick up electronic components 2 and install same on a circuit board 1 to increase. Variation in the amount of time required for such installation operation causes limitations on the installation sequence for electronic components of different types, in tasks where electronic components 2 of different types are being installed in a sequential fashion.

Therefore, in the present embodiment, the aforementioned component installation position 33 is constructed to be movable in the Y direction. Specifically, the pair of conveyance rails 35 and the position registering support platform 37 provided at the component installing position 33 are disposed on top of a Y direction table 41, as illustrated in FIG. 3. The Y direction table 41 is moved reciprocally along guide rails 49 in the Y direction, by means of forward and reverse rotation of a screw axle 42*a* driven by a motor 42. For example, there may be a case where the installing head 21 traverses the conveyance path 30 in order to pick up electronic components 2 in the component supply section 8 or 13, for instance, by moving from above the circuit board 1 indicated by the solid lines in FIG. 5 to the cassette component supply section 13. In such a case, the position registering support platform 37, in other words, the component installing position 33, is also moved towards the component supply section 8 or 13 on the side to which the installing head 21 is moving, similarly to the circuit board 1 indicated by the phantom lines in FIG. 5. Such is done at the same time that the installing head 21 is moving, or at least before the installing head 21 begins to install the next electronic component 2. Thereby it is possible to shorten the distance moved by the installing head 21 in order to install the picked up electronic components 2 at prescribed positions on the circuit board 1.

With the construction described above, it is possible to reduce the difference in required time for installing electronic components 2 at prescribed positions on a circuit board 1 after picking up same, between cases where the installing head 21 picks up and installs electronic components 2 of various types in a sequential fashion, without traversing the conveyance path 30, and cases where the installing head 21 picks up and installs electronic components 2 of various types in a sequential fashion, whilst traversing the conveyance path 30. Therefore, even if no particular consideration is given to the installation sequence for electronic components 2 when the installing head 21 is installing electronic components 2 of various types at prescribed positions on a circuit board 1 in a sequential fashion, it is still possible to adapt to high-speed operation of component installation, without causing working efficiency to decline significantly due to movement of the installing head 21 across the conveyance path 30.

Moreover, by utilizing the period of time from the installing head 21 picking up an electronic component 2 until installing it on the circuit board 1 for the purpose of moving the position registering support platform 37 across the conveyance path 30 in accordance with the movement of the installing head 21, it is not necessary to provide a special time period for moving the position registering support platform 37, and therefore achievement of high-speed component installation is not impeded thereby.

One of the pair of conveyance rails 35 is held fixedly to the top of the Y direction table 41, whilst the other is held movably along the guide rails 46 running in the Y direction. These conveyance rails 35 are expanded and contracted in terms of the interval therebetween by synchronous forward and reverse rotation of screw axles 44*a*, 44*b* driven by a motor 43 via a belt and pulleys, in such a manner that they can be adjusted to suit the width dimension of the circuit board 1 onto which components are to be installed, in the direction orthogonal to its direction of conveyance. Moreover, simultaneously with this adjustment process, the position registering support platform 37 is caused to move reciprocally along a Y-direction guide rail 47 at ½ the speed of the movable conveyance rails 35, by means of forward and reverse rotation of a screw axle 45 linked directly to the motor 43. In other words, it is devised that the position registering support platform 37 always maintains a prescribed position between the pair of conveyance rails 35, for example, a central position therebetween, and hence it is able to support a circuit board 1 from below and register the position of same, in a state where the centre of the position registering support platform 37 coincides with the centre of the circuit board 1 accommodated between the pair of conveyance rails 35.

The installing head 21 comprises a plurality of component installing tools 51–54 for installing components aligned in the X direction which is also the direction in which the component supply cassettes 12 and tray component supply mechanisms 7 are adjacently positioned, and a recognition camera 55 for identifying positions on the circuit board 1 onto which the electronic components 2 picked up by the various component installing tools 51–54 are to be installed. The various component installing tools 51–54 and the recognition camera 55 are arranged respectively in a linear configuration. The various component installing tools 51–54 correspond to the types of electronic components 2 that they respectively handle, and specifically, they comprise, for example, a suction nozzle for sucking up and holding an electronic component 2, a chuck for gripping an electronic component 2, and the like. In the present embodiment, the respective tools are suction nozzles.

In conjunction with the installing head 21 of this kind, component holding sections 61–64 are provided on at least one of the shuttles 26 performing a reciprocal motion whereby a tray 4 is selected from the adjacently positioned tray component supply mechanisms 7, moved from its storage position 5 to a component supply position 6, and then stored back in its storage position 5, (in the present embodiment, one of the shuttles 26). The component holding sections 61–64 hold electronic components 2 in a direction and at a pitch which correspond to the alignment direction and pitch of the component installing tools 51–54. Moreover, a component transfer head 65 is also provided for picking up electronic components 2 accommodated in a tray 4 which has been moved to a component supply position 6 of a respective tray component supply mechanism 7, and transferring same to said component holding sections 61–64, where they are held. The installing head 21 picks up the electronic components 2 held by the component holding sections 61–64 and installs them at prescribed positions on the circuit board 1.

The component holding sections 61–64 should correspond to the types of electronic components respectively handled thereby and the electronic components 2 held thereby should be capable of being picked up by the component installing tools 51–54 of the installing head 21. In the present embodiment, these respective tools are suction nozzles, which correspond to flat electronic components 2 which are handled by being accommodated in trays 4. The component transfer head 65 also comprises a component transfer tool 67 which corresponds to the type of electronic component 2 handled thereby, and in the present embodiment, it employs a suction nozzle, which corresponds to flat electronic components 2 handled by being accommodated in trays 4.

The component transfer head 65 is supported by an X table 68 and moves reciprocally along the X table 68 by means of forward and reverse rotation of a screw axle 68b driven by a motor 68a. The X table 68 is fixed directly on a cabinet 66, which covers all of the tray component supply mechanisms 7 jointly provided in the tray component supply section 8, above the portion thereof where exit and entry holes 66a for the trays 4 moved by the shuttles 26 are provided. The range of reciprocal movement of the component transfer head 65 is a range which allows it to pass between both of the respective component supply positions 6 of the adjacently positioned tray component supply mechanisms 7. In order to pick up electronic components 2 from each tray 4 by means of the component transfer head 65 and load the picked up electronic components 2 onto the component holding sections 61–64, a movement of each tray 4 in the extract/retract direction by means of a shuttle 26 is utilized. Thereby, electronic components 2 at any position on each tray 4 can be picked up, and furthermore, the picked up electronic components 2 can be transferred to any one of the component holding sections 61–64. However, the component transfer head 65 can also be devised such that it is capable of moving in both X and Y directions.

With the foregoing construction, when supplying electronic components 2 of special types by means of a plurality of adjacently positioned tray component supply mechanisms 7, whilst an installing head 21 handles electronic components 2 supplied by a cassette component supply section 13, in a continuous fashion corresponding to the frequency of use thereof, if there is surplus time until the next electronic component 2 from a tray 4 is used, this time period is utilized to load a prescribed number of electronic components 2 onto a plurality of component holding sections 61–64 provided on one of the shuttles 26 used to extract and retract the trays 4 in the adjacently positioned tray component supply mechanisms 7, by means of a component transfer head 65. Thereupon, the loaded prescribed number of electronic components 2 are picked up in one operation at the required time by means of the component installing tools 51–54 in the installing head 21, which match the alignment direction and pitch of the component holding sections 61–64, and are handled and installed simultaneously. Consequently, even in cases where a portion of the component installing tools 51–54 have picked up electronic components 2 directly from the trays 4 located at the component supply positions 6, the installation efficiency of the electronic components 2 supplied by the tray component supply section 8 will improve by double the number of electronic components 2 which are picked up simultaneously, and hence very significant increases in component installation speed can be achieved. Therefore, appropriately, the component holding sections 61–64 should be provided in equal number to the component installing tools 51–54 of the installing head 21, as in the present embodiment.

The simultaneous handling of a plurality of electronic components 2 by the installing head 21 employing component holding sections 61–64 is especially effective in cases where the same electronic components 2 are installed simultaneously onto a plurality of circuit boards 1 which have been unified, in order to manufacture a so-called 'split' board wherein a plurality of circuit boards 1 are unified into one body and electronic components 2 are installed thereon to form a prescribed electronic circuit board 3, which is then split into individual electronic circuit boards 3. In a case of this kind, it is also possible to pick up a plurality of the same electronic components 2 from the cassette component supply section 13, simultaneously, and to install these simultaneously onto the plurality of unified circuit boards 1, respectively. In this case, it is necessary that the alignment pitch between component supply cassettes 12 in the cassette component supply section 13, which are capable of supplying the same electronic components 2 simultaneously, matches the alignment pitch between the plurality of component installing tools 51–54 in the installing head 21 for picking up the electronic components 2 simultaneously.

Furthermore, in the present embodiment, the trays 4 in the right-hand tray component supply mechanism 7 having component holding sections 61–64 are retracted to the storage position 5 by means of the shuttle 26, as illustrated in FIG. 1, and a tray 4 in the left-hand tray component supply mechanism 7 is extracted to the component supply position 6 by means of the shuttle 26, whereupon electronic components 2 accommodated in the tray 4 extracted to the left-hand component supply position 6 are loaded onto the component holding sections 61–64 on the shuttle 26 holding the right-hand tray 4 in the storage position. Thereby the operation of handling the aforementioned plurality of electronic components 2 simultaneously by means of the installing head 21 can be carried out in a simple and time-efficient manner. It is also possible for both right and left-hand shuttles 26 to be provided with component holding sections 61–64, which can be used selectively. In this case, when the left-hand shuttle 26 is made to retract the trays 4 to the storage position 5, conversely to the foregoing example, it is possible for electronic components 2 accommodated in a tray 4 extracted to the right-hand component supply position 6 to be loaded onto the component holding sections 61–64 provided on the left-hand shuttle and to be handled and supplied for use simultaneously by the installing head 21, thereby providing a merit in that various types of electronic components 2 can be handled simultaneously, in a sequential fashion.

Moreover, regardless of whether or not component holding sections 61–64 are provided on the shuttles 26 of the tray component supply mechanisms 7, the installing head 21 is still capable of picking up electronic components from respective trays 4 extracted from both the left and right-hand tray component supply mechanisms 7, as illustrated in FIG. 2, in a continuous fashion corresponding to the required number of components, whereupon it can install these components simultaneously at prescribed positions on the circuit board 1. In this case, electronic components 2 picked up from one or both of the left and/or right-hand trays 4 and electronic components 2 picked up from the component holding sections 61–64 can be handled simultaneously, and can be installed simultaneously at prescribed positions on the circuit board 1.

Furthermore, in the present embodiment, the component transfer tool 67 is devised in such a manner that, before being held by the component holding sections, electronic components 2 picked up from the trays 4 are rotated preliminarily in a direction corresponding to their orientation when installed on the circuit board 1 by the installing head 21, on the basis of the fact that they are stored in the trays 4 in a prescribed orientation.

The electronic components 2 are thus rotated preliminarily without needing to provide a special time period for same, during the component supply operation performed by the tray component supply section 8 whilst electronic components 2 supplied from the cassette component supply section 13 are being installed by the aforementioned installing head 21. Therefore, the time period required for verifying the image of electronic components 2 after they have been picked up by the installing head 21, and rotating same to a prescribed orientation, is eliminated, and hence electronic components 2 can be installed immediately after they have been picked up, thereby making it possible to achieve further increases in component installation speed.

Corresponding to the fact that the installing head 21 installs electronic components 2 supplied from component supply sections 8, 13 located on either side of the conveyance path 30 as stated above, at prescribed positions on a circuit board 1 registered in a prescribed position on the conveyance path 30, two recognition cameras 71, 72 are provided at either end of the range of movement in the Y direction of the position registering support platform 37 in the conveyance path 30. Of these recognition cameras 71, 72, the camera located in the path of travel of the installing head 21 when picking up a supplied electronic component 2 and moving over the circuit board 1 identifies the positions and orientations of the electronic components 2 held by the component installing tools 51–54 of the installing head 21. On the basis of image data from the identification image, the amount of movement required for the electronic components 2 to be installed in prescribed positions on the circuit board 1 is determined and the amount of correction required in the orientation of the electronic components 2 which have been picked up and held is also determined from same. Thereupon the orientation of the electronic components 2 is corrected by rotating the component installing tools 51–54 holding the electronic components 2 by the determined amount of correction, and the electronic components 2 are then installed in prescribed positions on the circuit board 1.

According to the foregoing construction, since the electronic components 2 held by the respective component installing tools 51–54 in the installing head 21 are subjected to image verification, it is possible to eliminate wasteful doubling-back movement, and the like, of the installing head 21, and hence this does not provide an impediment to high-speed component installation.

The task of installing the electronic components 2 held by the respective component installing tools 51–54 of the installing head 21, after correction of their orientation, is carried out once the overall position of the circuit board 1 as indicated by the recognition camera 55 attached to the installing head 21, and the component installation positions on the circuit board 1, have been verified by imaging. Specifically, in order to pick up and install electronic components 2 from the component supply section 8 or 13 on the other side of the conveyance path 30 from the installing head 21, the position registering support platform 37 is moved in the Y direction towards the component supply section 8 or 13 where electronic components 2 are to be picked up, and said electronic components are duly installed. Therefore, since the position registering support platform 37 is moved in an opposite direction to its previous direction of movement such that it reaches a prescribed position immediately before the electronic components 2 are installed, it may occur that the platform 37 does not arrive at the prescribed position accurately, due to control errors, the effects of back lash in the driving mechanism, or the like. Consequently, if the overall position of the circuit board 1 and the component installation positions, as verified by images from an recognition camera 55 in the installing head 21, are taken as references, discrepancies are liable to occur in the component installation position.

Figure 4:
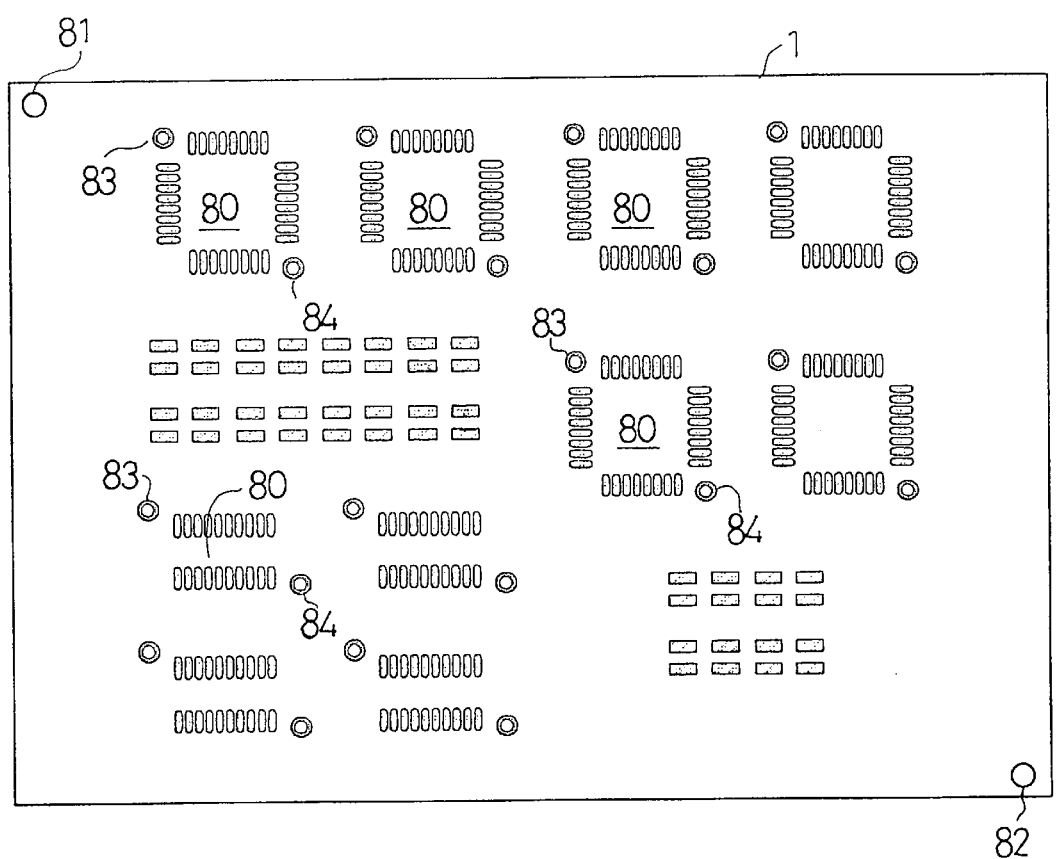
FIG. 4 is a plan view showing one example of a circuit board on which electronic components are installed.

Therefore, in the present embodiment, each time the position registering support platform 37 is moved towards the component supply section 8 or 13 where electronic components 2 are to be picked up by means of the installing head 21 traversing the conveyance path 30, and halts its movement, the overall position of the circuit board 1 is subjected to image verification by the recognition camera 55 in the installing head 21, by means of the overall position marks 81, 82 illustrated in FIG. 4, and the installation position 80 of the electronic component 2 on this circuit board 1 is subjected to image verification by means of the installation position marks 83, 84. The electronic component 2 picked up from the component supply section 8 or 13 by means of the installing head 21 moving across the conveyance path 30 on the basis of this image verification is installed at a prescribed position on the circuit board 1 supported on the position registering support platform 37, which has moved to and halted in a prescribed position on the side adjacent to the component supply section 8 or 13 from which the electronic component 2 has been picked up. Hence, by moving in an opposite direction to the previous direction of movement immediately before the electronic component 2 is installed, it is possible to install the electronic component 2 accurately in a prescribed position on the circuit board 1, without being affected by any variation which may occur in the position at which the position registering support platform 37 halts, due to control error, the effects of back lash in the driving mechanism, or the like.

Figure 5:
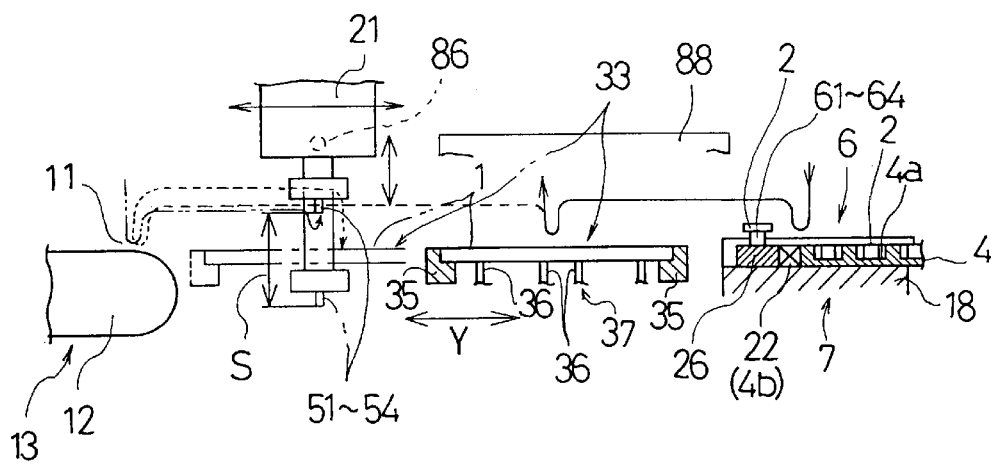
FIG. 5 is an explanatory diagram illustrating the positional relationships between the position registering support platform in FIG. 3, a cassette component supply section and tray component supply section located on either side thereof, and an installing head.
Figure 6:
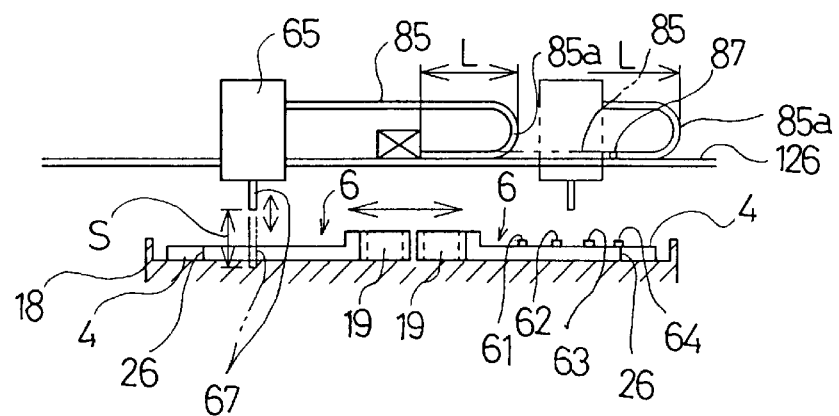
FIG. 6 is an explanatory diagram illustrating the positional relationships between trays located in respective component supply positions of adjacently provided tray component supply mechanisms, and a component transfer head.

Each of the component installing tools 51–54 in the installing head 21 and the component transfer tool 67 in the component transfer head 65 are provided with a downward stroke S, as illustrated in FIG. 5 and FIG. 6. This downward stroke S interferes with the circuit board 1, tray 4, or the like, which is the object being handled by the tool, in such a manner that the operations of picking up, installing and loading the electronic components 2 can be performed by the component installing tools 51–54 and component transfer tool 67 in an accurate manner. Therefore, if either one or both of the installing head 21 and/or the position registering support platform 37 move(s) in a direction approaching the other thereof, or if either one or both of the component transfer head 65 and/or the tray 4 move(s) in a direction approaching the other thereof, when the component installing tools 51–54 are in a lowered state, they will interfere with same and cause damage.

The operating program for the control device must be devised in such a manner that an operational state of this kind is avoided. However, in adopting a software response of this kind, the possibility that malfunction may occur due to noise, or some other reason, leading to the aforementioned problem of interference, cannot be discounted.

Therefore, in the present embodiment, an area sensor 86 as illustrated in FIG. 5 is provided to prevent interference between the installing head 21 and the position registering support platform 37, and an area sensor 87 as illustrated in FIG. 6 is provided to prevent interference between the component transfer head 65 and the trays 4 or shuttle 26.

The area sensor 86 detects whether one or more of the component installing tools 51–54 in the installing head 21 lies inside the positional range corresponding to the circuit board 1 on the position registering support platform 37, and in the present embodiment a photosensor is used. The area sensor 86 is attached, for example, to the installing head 21, and corresponding to this, a light shielding plate 88 having a length corresponding to the Y dimension of a circuit board 1 of maximum size is provided on the position registering support platform 37, in such a manner that it moves integrally with the circuit board 1 and hence enables the position registering support platform 37 to be moved only when the area sensor 86 detects the light shielding plate 88.

Thereby, even in cases where a control error, malfunction, or the like, has occurred, it is still possible to detect accurately by hardware means using the area sensor 86 if the installing head 21 is positioned outside the component installing range over the position registering support platform 37, and to prohibit movement of the position registering support platform 37 in such a case, thereby making it possible reliably to prevent mutual interference and damage if the position registering support platform 37 moves towards the installing head 21 when the component installing tools 51–54 are in a lowered state whilst the installing head 21 is at a position outside the component installing range on the position registering support platform 37. Moreover, since the light shielding plate 88 corresponds to the size of a circuit board 1 of maximum size, no problems occur even if the size of the circuit board 1 changes. However, the length of the light shielding plate 88 should be adjusted, or should be capable of being adjusted, in accordance with adjustment of the interval between the conveyance rails 35 corresponding to the size of the circuit board 1. The light shielding plate 88 can also be replaced according to circumstances. Furthermore, besides the combination of a photosensor and light shielding plate described here for the area sensor 86, it is also possible to use any type of hardware means having a similar function.

In the range where the area sensor 86 does not detect the light shielding plate 88, any component installation operation by lowering the component installing tools 51–54 of the installing head 21 is prohibited. In conjunction with this, if one or more of the component installing tools 51–54 is in a lowered position and the area sensor 86 is not detecting the light shielding plate 88, then the position registering support platform 37 is prohibited from moving in the Y direction.

The area sensor 87 detects whether or not the component transfer head 65 is in a position whereby it will interfere with the tray 4 of either one of the tray component supply mechanisms 7, and in the present embodiment, a photosensor is employed for this area sensor 87. Utilizing the fact that the U-bend section 85a of the air tube 85 connected to the suction nozzle, which forms the component transfer tool 67 of the component transfer head 65, moves with any movement of the component transfer head 65, at ½ the speed thereof, the length L of the air tube 85 extending along the tube guide 126 varying accordingly, the area sensor 87 is attached to a fixed member, such as the tube guide 126, or the like, and detects which of the tray component supply mechanisms 7 the component transfer head 65 is located next to, by means of the length of the air tube 85 extending along the tube guide 126. Specifically, whilst the area sensor 87 is detecting the air tube 85 as indicated by the phantom lines in FIG. 6, it is judged that the component transfer head 65 is located on the side of the right-hand tray component supply mechanism 7 in FIG. 6. In this case, any extracting or retracting operation of the trays 4 in the right-hand tray component supply mechanism 7 is prohibited, and the component transfer tool 67 is permitted to be lowered. However, the component transfer head 65 is prohibited from moving towards the left-hand tray component supply mechanism 7 whilst the component transfer tool 67 is in a lowered state. At the same time, extracting or retracting operation of the trays 4 in the left-hand tray component supply mechanism 7 is permitted. On the other hand, whilst the area sensor 87 is not detecting the air tube 85 as indicated by the solid lines in FIG. 6, it is judged that the component transfer head 65 is located on the side of the left-hand tray component supply mechanism 7 in FIG. 6. In this case, any extracting or retracting operation of the trays 4 in the left-hand tray component supply mechanism 7 is prohibited, and the component transfer tool 67 is permitted to be lowered. However, the component transfer head 65 is prohibited from moving towards the right-hand tray component supply mechanism 7 whilst the component transfer tool 67 is in a lowered state. At the same time, extracting or retracting operation of the trays 4 in the right-hand tray component supply mechanism 7 is permitted. It is possible to use any type of hardware means for the area sensor 87 having a similar function, besides the combination of a photosensor and light shielding plate described here. However, since attaching the area sensor 87 to a fixed member also enables electrical detection wiring to be fixed, this allows relatively simple installation compared to a case where the sensor is attached to a moving member.

It should be noted that the object of the area sensor 87 is to detect which component supply position 6 the component transfer head 65 is located in, and it may be composed in many different ways. For instance, besides detecting elements resembling the air tube 85, such as electrical wiring paths, or the like, it is also possible to detect a long member which is connected to the component transfer head 65 and moves in conjunction with same, the current location of the component transfer head 65 being detected between a plurality of component supply positions 6 according to the movement of the long member coupled to the component transfer head 65. However, by using a previously installed member, such as the air tube 85, it is not necessary to provide a special member for this purpose, and hence low costs can be achieved.

As described above, by detecting an interference operating region between the installing head 21 and position registering support platform 37 and an interference operating region between the installing head 21 and a tray 4 or shuttle 26, by hardware means, it is possible reliably to prevent interference by judging interference conditions according to the positional relationships based on the actual movements performed, regardless of the operating program in the control device and the control performed on the basis of same. Moreover, it is also suitable to make combined use of interference prevention by hardware means of this kind and interference prevention by software as described previously.

Moreover, in the present embodiment, the installing head 21 is devised in such a manner that, when a problem occurs with the electronic component 2 being handled, due to an installation fault or other problem, the installing head 21 discharges the problem component onto one of two problem component processing conveyors 91 located in prescribed positions on either side of the cabinet 66 of the tray component supply section 8 illustrated in FIG. 2, for example. The problem component processing conveyor 91 is driven intermittently by a prescribed amount by means of a motor 92, whenever it receives a problem component, and the received components are thus conveyed in a uniform direction at a uniform pitch P and supplied for reinstallation, disposal, or other processing. Furthermore, if the dimensions or surface area of the problem component thus received are larger than a standard component, then the conveyance distance is increased by an integral factor (P×n) corresponding to the size ratio thereof. The reference component can be set appropriately to any desired size of a prescribed type of component, for instance, a particular size of flat package component, or the like.

Thereby, if there occurs a component causing an installation fault or other problems, when the installing head 21 is successively picking up supplied electronic components 2 of various types and installing same on a circuit board 1, then this component is discharged onto a problem component processing conveyor 91 located in a prescribed position. These components are conveyed at a uniform pitch P by the problem component processing conveyor 91 such that a space for receiving the next electronic component 2 is provided, and the problem components on the problem component processing conveyor 91 are processed manually for reuse, disposal, or the like, according to their respective states. Even if the electronic components 2 handled by the installing head 21 are of various different sizes, since each problem component processing conveyor 91 is transported intermittently by the motor 92, by an amount (P×n) corresponding to the size of the electronic component 2 discharged on the problem component processing conveyor 91, it is possible to prevent situations where two discharged electronic components 2 overlap and interfere with each other, causing mutual damage or causing a component or components to slide off the conveyor. Furthermore, since the conveyance distance is reduced to a minimum pitch P for small problem components, it is also possible to prevent situations where the whole problem component processing conveyor 91 is transported further than necessary, the discharged electronic components 2 are transported too rapidly, and hence the staff responsible do not have the opportunity to process these problem components correctly.

In the present embodiment, a tool stocker 128 for stocking a variety of component installing tools which can be exchanged variously with the component installing tools 51–54 is also provided within the movement range of the installing head 21, so that electronic components 2 of various types can be handled as appropriate. If necessary, it is also possible to devise the component transfer tool 67 in such a manner that it can be exchanged for a tool of this kind.

Figure 7:
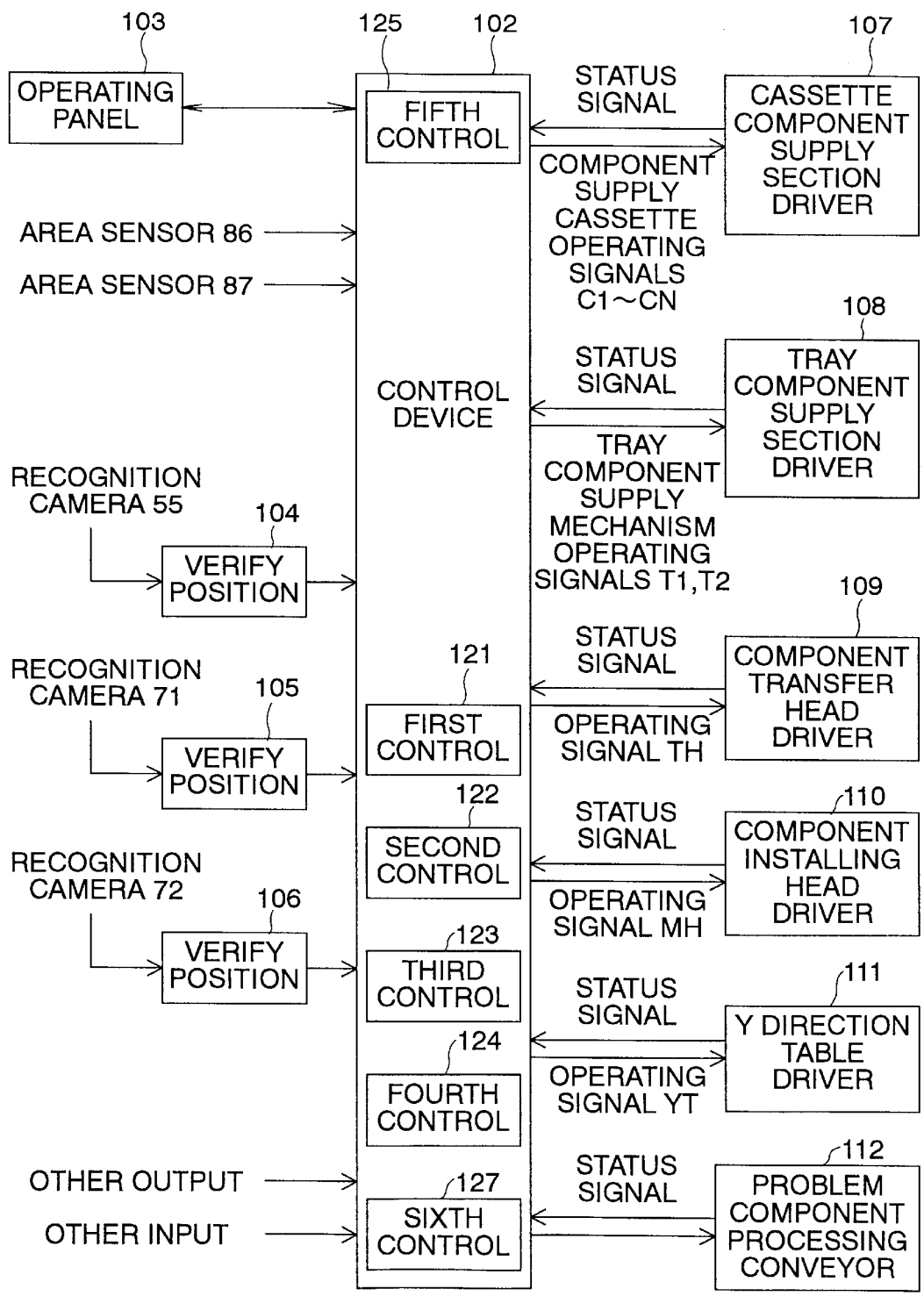
FIG. 7 is a block diagram of a control device for the component installing device in FIG. 1.

The operational control of the aforementioned component installing device is carried out by means of a control device 102 provided inside the device main unit 101 illustrated in FIG. 1. The control device 102 may, suitably, employ a microcomputer, but the invention is not limited to this. In order to perform the aforementioned operational control, the basic construction of the control device 102 is such that an input/output port thereof is connected to an operating panel 103 provided in the device 101 as shown in FIG. 7. Verification circuits 104–106 for obtaining required positional information by image processing of inputs from the area sensors 86, 87 and the various recognition cameras 55, 71, 72, are connected to an input port. An output port is connected to the objects under operational control, namely, a driver 107 for the cassette component supply section 13, a driver 108 for the tray component supply section 8, a driver 109 for the component transfer head 65, a driver 110 for the component installing head 21, a driver 111 for the Y direction table 41, and a driver 112 for the problem component processing conveyors 91, in such a manner that signals designating the operational status of each object under control can be input respectively in real time.

The operational control of the problem component processing conveyors 91 described above is performed by sixth control means 127 forming an internal function of the control device 102. The operational restriction of the trays 4 according to the area sensor 86 is carried out by first control means 121 forming an internal function of the control device 102. The operational restriction of the trays 4 and component installing head 21 according to the area sensor 86 and the operational status of the component installing tools 51–54 as input to the control device 102 is performed by second control means 122 forming an internal function of the control device 102. The operational restriction of the trays 4 according to the area sensor 87 is performed by third control means 123 forming an internal function of the control device 102, and the operational restriction of the trays 4 and component transfer head 65 according to the area sensor 87 and the operational status input to the control device 102 is performed by fourth control means 124 forming an internal function of the control device 102. As described above, the device is capable of performing component installing operation in two different modes: in the first component supply mode, respectively selected trays 4 in respective tray component supply mechanisms 7 as described above are moved simultaneously to component supply positions 6, as illustrated in FIG. 2, thereby supplying the electronic components 2 accommodated in the trays 4 for use; and in the second component supply mode, electronic components 2 accommodated in a tray 4 moved to a component supply position 6 of a tray component supply mechanism 7 are loaded onto component holding sections 61–64 of the same shuttle 26 by means of a component transfer head 65, thereby supplying the electronic components 2 for use. By means of a fifth control means 125 forming an internal function of the control device 102, it is possible to perform either one of the first component supply mode or the second component supply mode only, or to perform both component supply modes conjointly, at various timings according to requirements, in conjunction with the supply of electronic components 2 by the cassette component supply section 13, in accordance with a component installing program. Moreover, the second component supply mode may also be controlled in such a manner that the supply of electronic components 2 from the cassette component supply section 13 is continued until there is a signal which indicates that the component installing head 21 has picked up all the electronic components 2 loaded on the component holding sections 61–64, on the basis of information indicating that electronic components 2 have been loaded to all of, or the required ones of, component holding sections 61–64, and that subsequent installation has been performed and loading of the electronic components 2 has ended.

In the first component supply mode described above, at the maximum, electronic components 2 of a number of types corresponding to the number of jointly provided tray component supply mechanisms 7 can be supplied and provided for use simultaneously, or successively, and therefore the efficiency of supplying electronic components 2 of plural types by means of tray component supply mechanisms 7 is improved. Moreover, in the second component supply mode, a plurality of electronic components 2 held in respective holding sections 61–64 of a shuttle 26 can be picked up and provided for use simultaneously by means of component installing tools 51–54, or the like, in the aforementioned component installing head 21, which have an alignment direction and alignment pitch matching those in which the plurality of electronic components 2 are held, and therefore the number of operations and the time period required for the electronic components 2 to be picked up and used can be reduced. By performing the loading of the aforementioned electronic components 2, and the like, in parallel with the operation of supplying components from further component supply sections, comprising a further tray component supply mechanism 7, cassette component supply sections 13 having component supply cassettes 12, and other such component supply mechanisms, it is possible to improve efficiency for tasks wherein a prescribed number of electronic components 2, or the like, are handled in a similar manner, for example, a task for installing the same component onto a split circuit board, as described above.

INDUSTRIAL APPLICABILITY

According to the component installing device and component supply device of the present invention, as described above, cassette component supply sections for handling small components having a high frequency of use, and a tray component supply section comprising a plurality of jointly provided tray component supply mechanisms for handling large or irregularly shaped components, are used in conjunction with each other, components being supplied and installed with good efficiency by means of various different component supply modes. Therefore it is possible to achieve further increase in the speed of component installation, thereby making the invention beneficially applicable to the field of electronic circuit board manufacture, where high productivity is sought.

What is claimed is:

1. A component installing device comprising:
    a tray component supply section (8) having a plurality of conjointly provided tray component supply mechanisms (7) for selecting trays (4) accommodating prescribed components (2), and moving said trays (4) from a storage position (5) to a component supply position (6), according to need, thereby providing the components (2) for use;
    a cassette component supply section (13) having a plurality of mutually aligned component supply cassettes (12) for carrying components in a tape cassette or a bulk cassette, and transporting said components to a component supply position (11), one at a time, thereby providing said components for use; and
    an installing head (21) for picking up components (2) accommodated in the respective trays (4) located at the component supply position (6) of the respective tray component supply mechanisms (7) in the tray component supply section (8), and installing the components (2) at prescribed positions on an installation object (1).

2. The component installing device according to claim 1, further comprising a plurality of component installing tools (51–54) on said installing head (21) for installing components (2) aligned in a prescribed direction;
    a plurality of shuttles (26), which perform reciprocal movement in such a manner that one of the plurality of shuttles move a selected tray (4) from the storage position (5) to the component supply position (6) and then return the same to said storage position (5);
    component holding sections (61–64) for holding components (2), provided on at least one of said shuttles (26) and aligned along a direction of movement and at a pitch corresponding to the alignment direction and alignment pitch of said component installing tools (51–54); and
    a component transfer head (65) for picking up components (2) accommodated in a tray (4) that has been moved to a component supply position (6) of a tray component supply mechanism (7) and for loading these components (2) onto said component holding sections (61–64);
    wherein said installing head (21) is able to pick up the components (2) held on said component holding sections (61–64) and install same at prescribed positions of the installation object (1).

3. The component installing device according to claim 2, wherein said component holding sections (61–64) are provided in equal number to the component installing tools (51–54) of the installing head (21).

4. The component installing device according to claim 2, wherein said component transfer head (65) is devised in such a manner that components (2) picked up from a tray (4) are rotated preliminarily in a direction corresponding to their orientation for installation on the installation object (1) by the installing head (21), before being held by the component holding sections (61–64).

5. The component installing device according to claim 2, wherein, in cases where a component (2) is a problem component which could cause an installation problem, the installing head (21) discharges said component onto a problem component processing conveyor (91) located at a prescribed position, said problem component processing conveyor (91) being driven intermittently by a prescribed amount, each time it receives a discharged problem component, thereby conveying received problem components in a uniform direction at a uniform pitch (P), in such a manner that they can be supplied for subsequent processing.

6. The component installing device according to claim 5, wherein, when a problem component received from the installing head (21) is larger than a reference component, when conveying the problem component, the problem component processing conveyor (91) increases the amount of conveyance by a factor corresponding to a size ratio of the reference component to the problem component.

7. A component supply device, comprising:

a plurality of adjacently provided tray component supply mechanisms (7) for selecting trays (4) accommodating prescribed components (2) and moving said trays (4) from a storage position (5) to a component supply position (6), according to need, thereby providing the components (2) accommodated therein for use;

a plurality of shuttles (26), which perform reciprocal movement in such a manner that they move a selected tray (4) of one of the respective tray component supply mechanisms (7) from the storage position (5) to the component supply position (6) thereof and then return same to said storage position (5);

component holding sections (61–64), provided on at least one of said shuttles (26), for holding components (2) in a prescribed alignment direction and at a prescribed alignment pitch and for providing same for use; and a component transfer head (65) for picking up components (2) accommodated in a tray (4) that has been moved to a component supply position (6) of a tray component supply mechanism (7) and for loading these components (2) onto said component holding sections (61–64);

wherein said tray component supply mechanisms (7) have a first component supply mode, whereby respective selected trays (4) are moved simultaneously to component supply positions (6), thereby providing the components (2) accommodated in the respective trays (4) for use, and a second component supply mode, whereby components (2) accommodated in a tray (4) located at a component supply position (6) of a tray component supply mechanism (7) are loaded onto the component holding sections (61–64) of the same shuttle (26) by means of the component transfer head (65), thereby providing said components for use.

8. The component supply device according to claim 7, wherein said component transfer head (65) comprises a component transfer tool (67) for picking up components (2) accommodated in a tray (4) located at a component supply position (6) and loading same onto the component holding sections (61–64) of a shuttle (26), and an area sensor (87) for detecting at which component supply position (6) of the respective tray component supply mechanisms (7) the component transfer head (65) is located, movement of the tray (4) being prohibited at the component supply position (6) where the area sensor (87) detects the component transfer head (65) to be located.

9. The component supply device according to claim 8, wherein said component transfer head (65) is prohibited from moving to another component supply position (6), when the component transfer tool (67) of the component transfer head (65) is lowered at the component supply position (6) where the area sensor (87) detects the component transfer head (65) to be located.

10. The component supply device according to claim 8, wherein the area sensor (87) is provided on a fixed section and detects a member connected to the component transfer head (65) and moving in conjunction with the component transfer head (65).

11. An electronic component installing device for automatically installing components onto a substrate, comprising:

a plurality of trays, each tray storing a plurality of components;

a tray supply section for storing the plurality of trays in a vertical array;

a movable shuttle member for selectively removing a tray from the tray supply section to a load position and replacing the tray in the tray supply section, the shuttle member having a plurality of component holding sections;

a component transfer head for removing a component from a tray at the load position and aligning the component on one of the plurality of component holding sections, prior to the mounting of the component on the substrate; and an installation head that can pick up the component on the component holding section and mount the component on the substrate.

12. The electronic component installing device of claim 11 further including a conveyance path unit for moving the substrate along a conveyance path relative to the load position of the tray to a component installation position operatively available to the installation head and a position registering support unit for moving the substrate off of the conveyance path in a direction of movement of the installation head to enable a pickup of a component and to decrease the movement distance of the installation head for subsequently loading a component on the substrate.

13. The electronic component installing device of claim 12 further including a first recognition camera on a first side of the conveyance path and a second recognition camera on a second side of the conveyance path, the first and second recognition cameras can image a picked up component.

14. The electronic component installing device of claim 13 further including a third recognition camera on the installation head to image a position of the substrate to enable alignment with the installation head.

* * * * *